US006516504B2

(12) United States Patent
Schaper (10) Patent No.: US 6,516,504 B2
(45) Date of Patent: *Feb. 11, 2003

(54) METHOD OF MAKING CAPACITOR WITH EXTREMELY WIDE BAND LOW IMPEDANCE

(75) Inventor: Leonard W. Schaper, Fayetteville, AR (US)

(73) Assignee: The Board of Trustees of the University of Arkansas, Little Rock, AR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/421,120

(22) Filed: Oct. 19, 1999

(65) Prior Publication Data

US 2002/0027763 A1 Mar. 7, 2002

Related U.S. Application Data

(62) Division of application No. 08/630,030, filed on Apr. 9, 1996, now Pat. No. 6,023,408.

(51) Int. Cl.$^7$ ................................................ H05G 7/00
(52) U.S. Cl. .................. 29/25.42; 361/304; 361/306.2; 427/79; 427/81
(58) Field of Search ...................... 29/25.42; 361/306.2; 361/304; 427/79, 81

(56) References Cited

U.S. PATENT DOCUMENTS

| | | | |
|---|---|---|---|
| 2,156,099 A | 4/1939 | Scheppmann | 175/41 |
| 2,389,420 A * | 11/1945 | Deyrup | 427/79 |
| 2,496,095 A | 1/1950 | Kallmann | 175/41 |
| 2,634,315 A | 4/1953 | Allison et al. | 175/41 |
| 2,648,804 A | 8/1953 | Steigerwalt et al. | 317/101 |
| 2,958,117 A * | 11/1960 | Robinson et al. | 361/304 |
| 3,324,362 A * | 6/1967 | Tassara | 361/304 X |
| 3,426,257 A | 2/1969 | Youngquist | |
| 3,721,871 A | 3/1973 | Heron | |
| 4,048,593 A * | 9/1977 | Zillman | 361/304 X |
| 4,161,766 A | 7/1979 | Castleberry et al. | 361/280 |

(List continued on next page.)

FOREIGN PATENT DOCUMENTS

| | | | |
|---|---|---|---|
| AT | 150465 | 8/1937 | |
| GB | 746936 | 3/1956 | |
| GB | 2152753 | 8/1985 | |
| JP | 403234010 A * | 10/1991 | 361/304 |
| SU | 445933 | 11/1974 | |

OTHER PUBLICATIONS

H.V. Bakoglu, *Circuits, Interconnections and Packaging for VLSI*, Ch. 7, Addison–Wesley (1990).
J. Galvagni, *Low Inductance Capacitors For Digital Circuits*, AVX Technical Information Brochure.
*Low Inductance Capacitor Arrays*, AVX Corporation product brochure.
H. Hashemi, et al., *The Close Attached Capacitor: A Solution to Switching Noise Problems*, Proceedings of the 42nd ECTC, pp. 573–582 (1992).
Murphy, Arthur T. et al., "High Frequency Performance of Multilayer Capacitors", IEEE Transactions on Microwave Theory and Techniques, vol. 43, No. 9, Sep. 1995, pp. 2007–2015.

*Primary Examiner*—Carl J. Arbes
(74) *Attorney, Agent, or Firm*—Miles & Stockbridge, P.C.

(57) ABSTRACT

A capacitor having a floating plate-shaped electrode, at least two patterned plate electrodes overlying the floating plate-shaped electrode, and a dielectric layer therebetween. The resulting structure exhibits high two-port insertion loss even at frequencies as high as 10 GHz. Notably, the capacitor exhibits an insertion loss of more than −40 dB over a range from 1 GHz to 10 GHz.

33 Claims, 6 Drawing Sheets

U.S. PATENT DOCUMENTS

| | | | |
|---|---|---|---|
| 4,218,723 A | * 8/1980 | Payne et al. ................. 361/321 |
| 4,439,813 A | * 3/1984 | Doughterty et al. |
| 4,471,405 A | * 9/1984 | Howard et al. ............ 427/79 X |
| 4,620,166 A | 10/1986 | De Faveri et al. .......... 333/184 |
| 4,675,717 A | 6/1987 | Herrero et al. |
| 4,814,940 A | 3/1989 | Horstmann et al. ......... 361/309 |
| 4,866,566 A | * 9/1989 | Nishiyama ............... 361/306.2 |
| 4,947,286 A | 8/1990 | Kaneko et al. |
| 5,032,949 A | 7/1991 | Sasaki et al. ............... 361/302 |
| 5,065,274 A | * 11/1991 | Berghout et al. ............ 361/321 |
| 5,097,391 A | * 3/1992 | Nomura et al. ............. 361/321 |
| 5,272,590 A | 12/1993 | Hernandez ............... 361/360.2 |
| 5,316,698 A | * 5/1994 | Tani et al. .................. 252/512 |
| 5,410,107 A | 4/1995 | Schaper |
| 5,422,782 A | 6/1995 | Hernandez et al. ...... 361/306.2 |
| 5,453,906 A | 9/1995 | Doll ........................... 361/273 |
| 5,652,693 A | 7/1997 | Chou et al. .............. 361/306.1 |
| 5,777,839 A | 7/1998 | Sameshima et al. ........ 361/311 |

* cited by examiner

METHOD OF MAKING CAPACITOR WITH EXTREMELY WIDE BAND LOW IMPEDANCE

CROSS-REFERENCE TO RELATED APPLICATION

This application is a division of application Ser. No. 08/630,030 filed Apr. 9, 1996 now U.S. Pat. No. 6,023,408.

GOVERNMENT LICENSE RIGHTS

The U.S. Government has a paid-up license in this invention and the right in limited circumstances to require the patent owner to license others on reasonable terms as provided for by the terms of Grant No. MDA972-93-1-0036 awarded by the Advanced Research Projects Agency (ARPA).

BACKGROUND OF THE INVENTION

The present invention is directed to parallel plate capacitors as well as decoupling capacitors for semiconductor applications. More specifically, the invention is directed to discrete, low inductance capacitors typically used in decoupling applications.

The purpose of power distribution systems is to deliver stable, noise-free power to integrated circuits (ICs) and other devices. One way to express this quantitatively is that the power distribution impedance, as seen from a chip, must be less than some value, over whatever frequency range is of interest. The value is determined by the voltage drop or noise tolerance of the chip when it is drawing maximum current. For example, simply considering the DC drop allowed for a chip drawing 5 A from a 5 V supply with a 5% voltage tolerance, the total power distribution impedance seen by the chip must be less than 50 mΩ. For AC noise, time domain equivalent circuit simulations are usually performed, since a wide range of frequencies is generated by digital circuitry. Simultaneous switching drivers generate di/dt noise, as has been exhaustively described elsewhere by H. B. Bakoglu, Circuits, Interconnections, and Packaging for VLSI, Chapter 7, Addison-Wesley, 1990, incorporated herein by reference.

Capacitors have been used for decoupling, or bypassing AC noise on DC power supply circuits for many years. These capacitors can be thought of as supplying localized energy storage for the varying current demands of circuitry, typically semiconductor circuits, and thus stabilizing the DC power.

At low frequencies, almost all capacitors are effective to decouple AC signals. Usually several capacitors are used on a printed circuit board to provide a very low impedance path for AC signals, while maintaining DC isolation. For example, tantalum electrolytic capacitors of 10 to 100 $\mu$F might be used to provide maximum energy storage and low frequency decoupling for an entire circuit board, while ceramic chip capacitors of 0.1 $\mu$F might be located next to every integrated circuit to provide a local path for grounding high frequency noise.

Such distributed capacitance schemes worked well when the clock frequencies of digital systems were relatively low, such as 10 to 20 MHz. However, as clock frequencies have increased to above 100 MHz, conventional capacitors are limited. The problem is that in reality, capacitors also exhibit inductance and resistance components, and this inductance becomes a problem at higher frequencies.

In that regard, a capacitor can be modeled as a series RLC circuit. The inductance is present because of the finite dimensions of the plates and the way in which the plates are connected to the remainder of a circuit, the later exerting a major influence at the higher frequencies. The limited dimensions of the conductors connecting the plates to the remainder of the circuit impart finite, though small, inductances. Even in capacitors of moderate sizes, the resulting inductance-capacitance (LC) combination can resonate at a fairly low frequency. For example, the typical 0.1 $\mu$F ceramic chip capacitor (measuring 0.12 inch by 0.06 inch) has a self-inductance of approximately 500 pH and is self resonant around 20 MHz. From DC to around 20 MHz, the impedance decreases down to a level of 150 mOhms, but above 20 MHz, the impedance increases, and the capacitor loses its decoupling effectiveness. Stated in these terms, the capacitor can be thought of as a four terminal device, whose function is to prevent AC disturbance imposed on one set of terminals from being coupled to the other set of terminals. In microwave terms, this two port network must have a high insertion loss ($S_{12}$) between the two ports, to be effective.

Also detrimental to effective decoupling is the inductance between the IC (integrated circuit) chip itself and the printed circuit wiring board power distribution planes to which the decoupling capacitors are connected. This inductance arises from the leads of the chip package. Connecting many leads in parallel to power and ground connections does not totally eliminate this effect.

If large current swings are required by the IC circuitry, this residual inductance can cause unacceptable voltage drops and AC noise. To counteract this effect, decoupling capacitors have been included in IC circuit packages, often as discrete chip components, but sometimes as multiple planes with thin dielectric layers between them, which in effect form integral capacitors. This latter arrangement is particularly effective in multilayer ceramic packages such as pin grid arrays (PGAs), quad flat packs (QFPs) and ball grid arrays (BGAs).

In multichip modules (MCMs), the effect of the inductances of chip-to-substrate interconnections can be minimized by using multiple interconnections and careful design both in a wirebond and in a flip chip environment. Similarly, the intrinsic inductance and resistance of power distribution planes, either solid, perforated, or the new IMPS (interconnected mesh power system), is extremely low, and does not determine the effectiveness of power distribution. My prior U.S. Pat. No. 5,410,107 describes the IMPS.

Thus discrete decoupling capacitors are critical elements for reducing power distribution noise.

In MCM applications, there are three inductances to consider: interconnects between chip and substrate, substrate power and ground planes, and the inductance of the capacitor itself, including its connection to the power and ground planes.

It has long been known that the least inductive capacitor is a parallel plate capacitor with a large area. The ultimate low-inductance capacitor in MCM substrates is the parallel plate capacitor consisting of a thin layer of high dielectric constant material sandwiched between power and ground planes. However, these capacitors are expensive to fabricate and contribute significantly to substrate defects. The need to distribute multiple voltages (e.g., 3.3 V, 5 V, etc.) makes their use prohibitive in many applications.

In an earlier patent of mine, U.S. Pat. No. 4,675,717, there is described such a capacitor in the context of a wafer-scale integrated (WSI) assembly, built on silicon substrates, in which the conductive silicon substrate forms the ground plate of the capacitor and allows the easy growth of a silicon dioxide dielectric layer. A metal layer formed over the dielectric layer serves as the other plate of the capacitor, in addition to serving as the power distribution plane. Such integrated power distribution and decoupling capacitor combinations have demonstrated low impedance characteristics without inductive resonances to tens of gigahertz. But again, such structures are expensive to produce, and do not work with many sets of packaging materials. Discrete capacitors are still required to handle the vast majority of decoupling applications.

Various manufacturers have made progress on reducing the inductance of discrete capacitors.

One such manufacturer, AVX Corporation, produces low-inductance capacitor arrays, designed in conjunction with IBM, in which multiple connections to the plates are made along one side of the unit or part, using solder bumps or thermocompression gold ball bonding. See, J. Galvagni, "Low Inductance Capacitors For Digital Computers," AVX Technical Information brochure, and AVX Corporation product brochure entitled "Low Inductance Capacitor Arrays," incorporated herein by reference. Such capacitors are made available under the designation AVX LICA—Low Inductance Decoupling Capacitor Arrays as an extension to IBM Corp.'s DCAP® decoupling capacitors. The AVX LICA are available in values from 30 to 150 nF. Custom designs incorporating multiple sections can be produced. Testing of these devices results in measurements of total inductance below 60 pH.

Another manufacturer, Murata, produces a very small capacitor (20×20×13 mil) having a capacitance of 10 or 2.2 nF. The contacts are on opposite 20 mil square faces. Though originally designed to be mounted with one face down and the other face wirebonded, it is possible to obtain even lower inductance by mounting the part with both terminals perpendicular to the plane of a substrate.

H. Hashimi and P. Sandborn have described what is referred to as a close attached capacitor (CAC) which is a unit that is mounted directly on the active area of an IC chip, and wirebonded to chip power and ground pads, to overcome inductance in the unit. See, H. Hashemi & P. Sandborn, "The Close Attached Capacitor: A solution to Switching Noise Problems," Proceedings of the 42 nd ECTC, 1992, pp. 573–582, incorporated herein by reference. Unfortunately, the wirebond connections are still significantly inductive, and the silicon-based capacitors are expensive.

Along other lines, there has been under development an integrated capacitor layer for printed wiring boards to simultaneously create many capacitors for radio frequency (RF) circuit applications as a replacement for discrete chip components. This layer uses patterned metal as a set of floating plates underneath an unpatterned deposited dielectric, above which a set of patterned metal plates including terminal pads is formed.

SUMMARY OF THE INVENTION

The present invention provides a new and novel capacitor structure and method for making same. The capacitor comprises an extremely low inductance floating plate capacitor which can be fabricated with as little as one patterning step. These devices can be fabricated in large quantity on sheet or roll material and subsequently excised by cutting or stamping.

These capacitors preferably are used in decoupling applications, which applications can advantageously utilize the low-inductance nature of the floating plate capacitor and its method of attachment. The extremely high insertion loss, i.e., decoupling effectiveness, of these capacitors is maintained at frequencies exceeding 1 GHz, even over a wide band from about 1 GHz to 10 GHz.

In an embodiment, the invention provides a capacitor which does not exhibit a significant increase in impedance with increasing frequency.

In an embodiment, the invention provides a capacitor which exhibits an average insertion loss of at least −40 dB at frequencies above 1 GHz.

In an embodiment, the invention provides a capacitor comprising a floating plate electrode, at least two patterned plate electrodes overlying the floating plate electrode, and a dielectric layer therebetween.

In an embodiment, the capacitor is effective to exhibit an insertion loss of at least −40 dB at frequencies from 1 to about 10 GHz.

In an embodiment, the floating plate electrode consists of a metal film (preferably aluminum or Ti—Cu) with a thickness of about 1000 Å to about 1 $\mu$m.

In an embodiment, the dielectric layer is selected from the group consisting of barium titanate, tantalum oxide, aluminum oxide, organic dielectrics and inorganic dielectrics.

In an embodiment, the dielectric layer is from about 2000 Å to about 1 $\mu$m thick.

In an embodiment, the at least two patterned plate electrodes are selected from the group consisting of metals, conductive inks and conductive pastes.

In an embodiment, the patterned plates comprise electroforms.

In an embodiment the invention provides an insulating layer or substrate on a face of the floating plate electrode opposite the at least two patterned plate electrodes.

In an embodiment, the insulating substrate is selected from the group consisting of oxidized metal, ceramic, silicon, glass and polymer.

In an embodiment, the invention provides a method of forming a capacitor comprising:
 a) forming a floating plate electrode;
 b) forming a dielectric layer over the floating plate electrode; and
 c) forming at least two patterned plate electrodes on the dielectric layer in overlying relationship with respect to the floating plate electrode.

In an embodiment the invention provides a method of forming a capacitor comprising:
 a) providing a metallic layer;
 b) providing a dielectric layer on one face of the metallic layer; and
 c) providing at least one pair of patterned electrodes on the dielectric layer on a side of the dielectric layer opposite the metallic layer.

In an embodiment, the invention further includes providing an insulating layer on a face of the metallic layer opposite the dielectric layer.

In an embodiment, the providing of the metallic layer with an insulating layer comprises providing a metallic layer and then oxidizing one side of the metallic layer until a sufficiently electrically insulating layer is formed.

In an embodiment, the metallic layer is aluminum.

In an embodiment, the metallic layer is a sheet of aluminum foil.

In an embodiment, the dielectric layer comprises barium titanate, tantalum oxide, aluminum oxide, an organic dielectric or an inorganic dielectric.

In an embodiment, the providing of the patterned plates can comprise sputtering plates onto the dielectric layer, photolithographically defining a metal, such as copper, onto the dielectric layer, screen printing a conductive ink or paste onto the dielectric layer, or electroplating an electroform in the dielectric layer.

In an embodiment, the providing of the metallic layer comprises providing a rollform metallic material.

In an embodiment, the providing of an insulating layer comprises applying an insulating layer to the rollform metallic material, e.g., by lamination, oxidation or other suitable application.

In an embodiment, a polymer sheet is coated with a metallic layer to provide the insulating layer and metallic layer, respectively.

These and other features and aspects of the invention are presented below with reference to the drawings in the following detailed description of the presently preferred embodiments.

DETAILED DESCRIPTION OF THE PRESENTLY PREFERRED EMBODIMENTS

As described above, the present invention provides discrete floating plate capacitors, manufactured with as little as one patterning step, preferably for decoupling applications which can utilize the low-inductance nature of the inventive capacitors to advantage.

Figure 1:
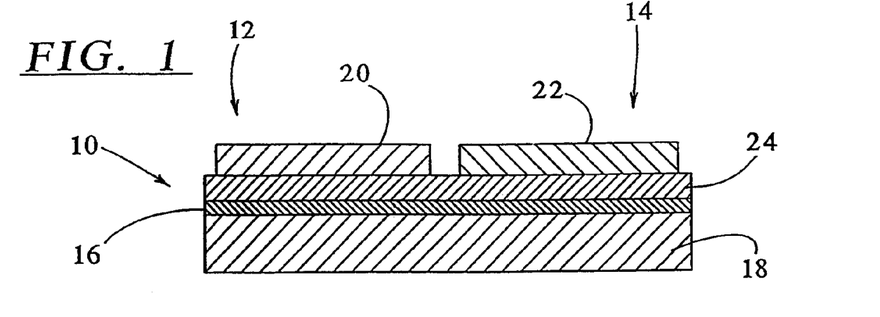
FIG. 1 illustrates a cross sectional view of a capacitor embodying principles of the invention.
Figure 2:
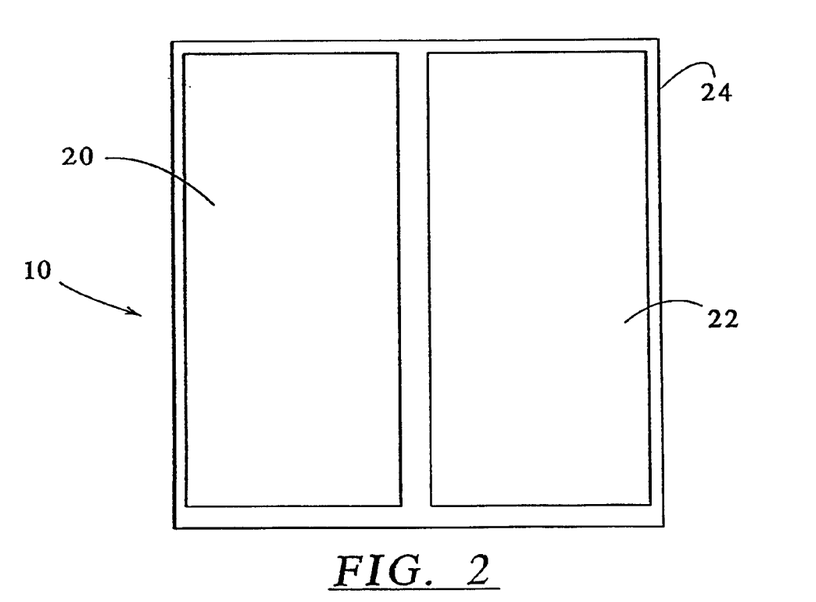
FIG. 2 illustrates a plan view of the capacitor of FIG. 1.

A floating plate capacitor 10 embodying principles of the invention is illustrated in FIGS. 1 and 2. There it can be seen that the floating plate capacitor 10 basically comprises two parallel plate capacitors 12 and 14 positioned side-by-side. The capacitors 12 and 14 have a common floating plate 16 supported on an insulating substrate 18, and separate patterned plates 20 and 22 positioned side-by-side above an intervening dielectric layer 24.

It will be appreciated that if the total area of the two capacitors 12 and 14 is A, there are effectively two capacitors connected in series, each having an area A/2. Thus, whatever capacitance C would be formed in area A/2, the resulting capacitance of the series connection of the capacitor pair is C/2. Since the capacitance of a single parallel plate capacitor of area A would be 2C, it is clear that the floating plate capacitor 10 can only produce one-fourth of the capacitance of a parallel plate capacitor of the same area.

However, a floating plate capacitor of the invention is advantageous in that both of its terminals appear on the same side of the capacitor, to wit, the patterned plates 20 and 22. This creates an economy of manufacture and an extremely low inductance connection to circuitry external to the capacitor, such as a planar power distribution network.

With continued reference to FIGS. 1 and 2, a fabrication sequence of the capacitor 10 will be explained.

As shown in FIG. 1, the fabrication sequence can begin with a large sheet of insulating material, such as ceramic, silicon, glass or polymer (including polymides), which then becomes the insulating substrate 18. A thin layer of a metal, such as aluminum, is applied to one side by sputtering, evaporation, or lamination, to form what will become the common floating plate 16. The layer 16 could be as thin as 1000 to 2000 Å and still provide sufficient low resistance, although larger capacitors may require a thickness of 1–2 $\mu$m.

Next, a barrier layer, such as barium titanate, tantalum oxide, aluminum oxide, or other inorganic or organic dielectric is applied by appropiate means, such as sputtering, thereby to form the dielectric layer 24. This layer 24 might typically be 2000 Å to 1 $\mu$m thick.

Next, one or more sets of patterned plates 18 and 20 are created on top of the dielectric 24. These plates 18 and 20 could consist of sputtered plates, photolithographically defined areas of copper or other metals, screen printed areas of conductive inks or pastes such as are used in polymer thick film circuitry, or electroplated forms. Optional capacitor terminal pads may then provided on the plates 18 and 20, if desired. An optional insulating covercoat could be similarly applied, leaving exposed only sets of capacitor terminal pads, but in many cases this covercoat would be unnecessary.

Finally, the resulting large sheet-like structure would be sawn, die cut or stamped into individual capacitors 10, as appropriate in the circumstances.

Alternatively, the fabrication process could be performed in reel-to-reel fashion on polymer film. In such a process, the capacitors are formed on a continuous ribbon of polymer film that can be wound from one supply reel to another take-up reel. The polymer film could serve as the insulating substrate 18.

Yet another alternative fabrication process could be performed wherein a metal sheet or foil, such as aluminum, is used to form the floating plate of the one or more capacitors. The metal sheet could also be provided in a roll form, e.g., in reel to reel form. The metal could be anodized to form the dielectric layer by known chemical processes, thus eliminating any vacuum processing steps. Of course, the dielectric layer could be provided by any other process described above. An insulating layer could be applied to the back of the processed metal layer or formed by oxidizing the back of the metal layer before or after the formation of the dielectric layer, or the metal layer could be laminated to a supporting insulator, such as FR-4 board before or after the formation of the dielectric layer. Thereafter, the patterned plates would be formed on the dielectric layer according to any of the methods set forth above (e.g., electroplated, photolithographically formed, made of pastes or inks, etc.).

In any event, the resulting structure would have or has inherently low inductance, as would or do the interconnections. For example, the plates 18 and 20 could be attached to a power distribution system at many points with conductive epoxy or solder, with each connection exhibiting an inductance of less than 50 pH. If dictated by the geometry of the interconnects, the two floating plates 18 and 20 could be broken up into smaller plates, as illustrated in FIG. 3, with some used for each polarity, with little increase in inductance.

It can be appreciated that in any of the foregoing fabrication processes, any need to pattern the dielectric layer is eliminated. Not patterning the dielectric layer removes the concern of having to use hydrofluoric acid (HF), or other environmentally dangerous manufacturing processes.

Versions of the above described capacitors could be mounted on IC chips designed to accomodate them. In such a case, the capacitors would fit inside the wirebond I/O frame and provide low inductance energy storage and power distribution noise reduction. Instead of being wirebonded, as in Hashemi's and Sandborn's scheme, the capacitors could be epoxy attached to pads on the chip, with far lower inductance.

Figure 3:
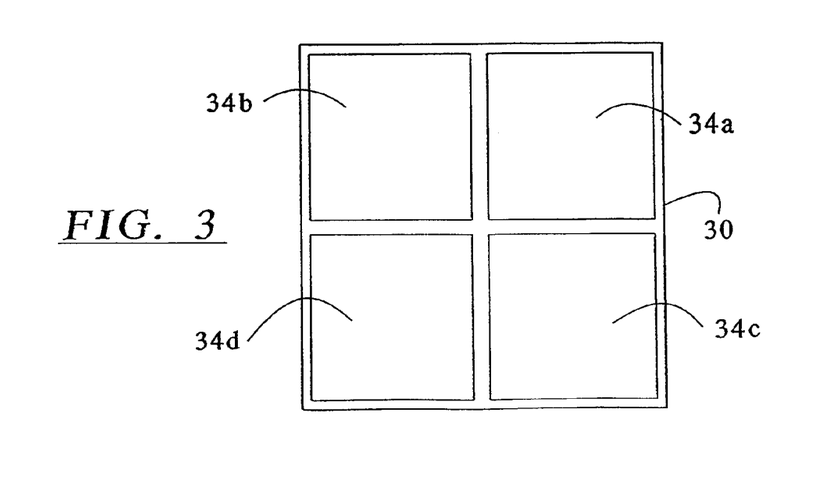
FIG. 3 illustrates a plan view of a capacitor with multiple sets of patterned plates.
Figure 4:
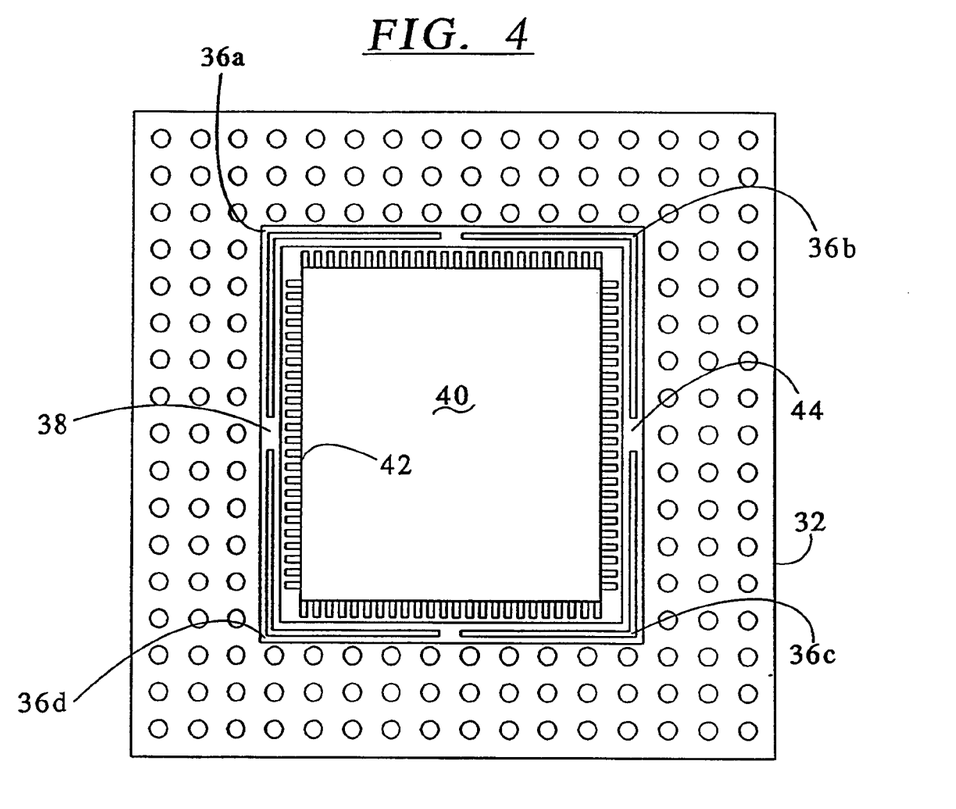
FIG. 4 illustrates a plan view of a BGA package including a capacitor embodying principles of the invention.
Figure 5:
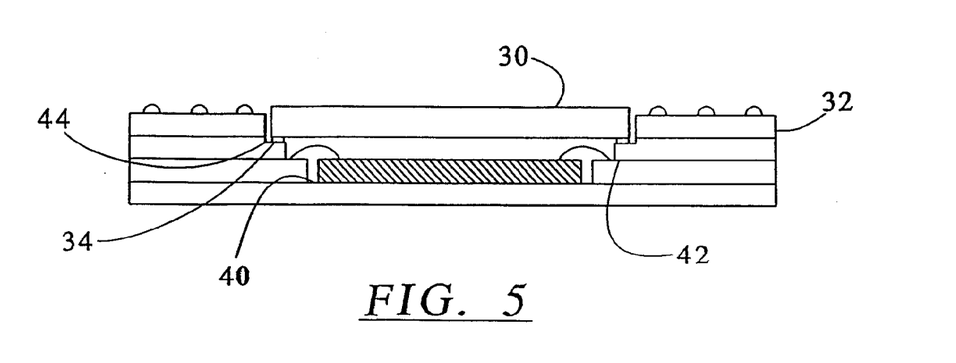
FIG. 5 illustrates a cross sectional view of the BGA package including a capacitor embodying principles of the invention of FIG. 4.

A particularly appealing application for the capacitors is as a replacement for the lid on PGA, BGA or QFP packages, as illustrated in FIGS. 3, 4 and 5. In FIGS. 3, 4 and 5, one such capacitor 30 is shown in a BGA package application 32. As can be seen, in this application, the conventional metal lid would be replaced by an appropiate rigid floating plate planar capacitor 30. In this embodiment, the capacitor 30 has two sets of patterned plates (i.e., four total) 34a–34d. This is best shown in FIG. 3.

As the cross sectional view in FIG. 5 shows, the typical BGA package already has three cavity levels: die attach surface 40, wirebond shelf 42, and lid attach shelf 44. In the top view illustrated in FIG. 4, long connection pads 36a–36d located about edge 38, which are connected to power and ground planes(not illustrated) are provided on the lid attach shelf 44.

It can be appreciated that the configuration shown is for four patterned plates 34a–34d on the capacitor 30, in order to distribute the power and ground connnections more evenly. These patterned plates 34a–34d mate with the connection pads 36a–36d, respectively, via connection by suitable quantities and deposits of anisotropic adhesive, conducive/non-conductive preform, or dispensed sections of conductive and non-conductive epoxy. In any event, conductive contact would exist between the connection pads 36a–36d and the plates 34a–34d, and not over the portions of the lid attach shelf 44 separating the connection pads 36a–36d. As will be apparent, this arrangement is such that there will be connection points disposed substantially at adjacent edges of adjacent patterned plate electrodes in correspondence with adjacent ends of pads 36a–36d. For example, plates 34c and 34d include connection points substantially at their adjacent edges where those plates contact adjacent ends of pads 36c and 36d.

As the capacitor 30 is inside the package cavity, no overcoat would be required. Since multiple vias would be provided from the capacitor attach pads 36a–36d to the internal power and ground planes, extremely low inductance connections would result.

As mentioned above, even the best currently available low inductance chip capacitors of several nF are ineffective above several hundred MHz. That is to say, these capacitors exhibit excessive inductance above several hundred MHz, and thus are not suitable for applications above that range. In contrast, current indications are that capacitors embodying the principles of the invention could provide more than 50 nF effective to several tens of GHz.

Figure 6:
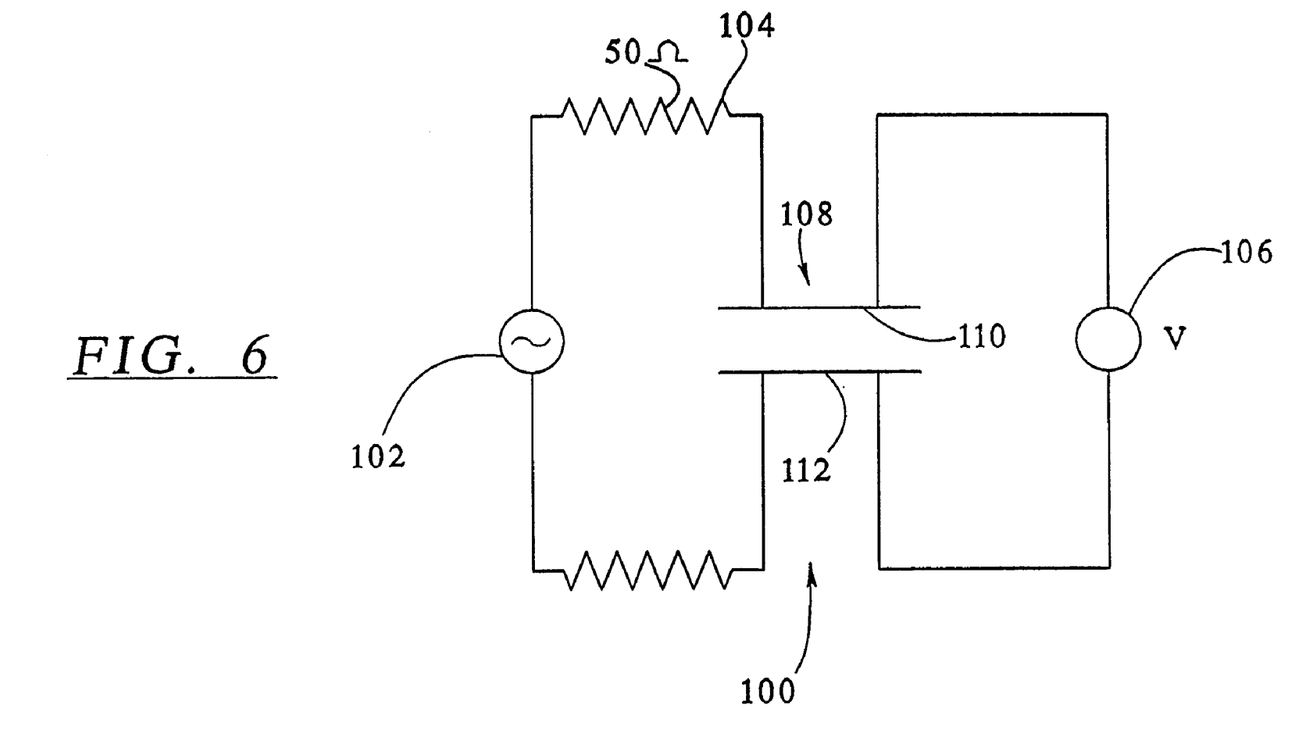
FIG. 6 illustrates a testing arrangement by means of which the results illustrated in FIG. 7 were produced.
Figure 7:
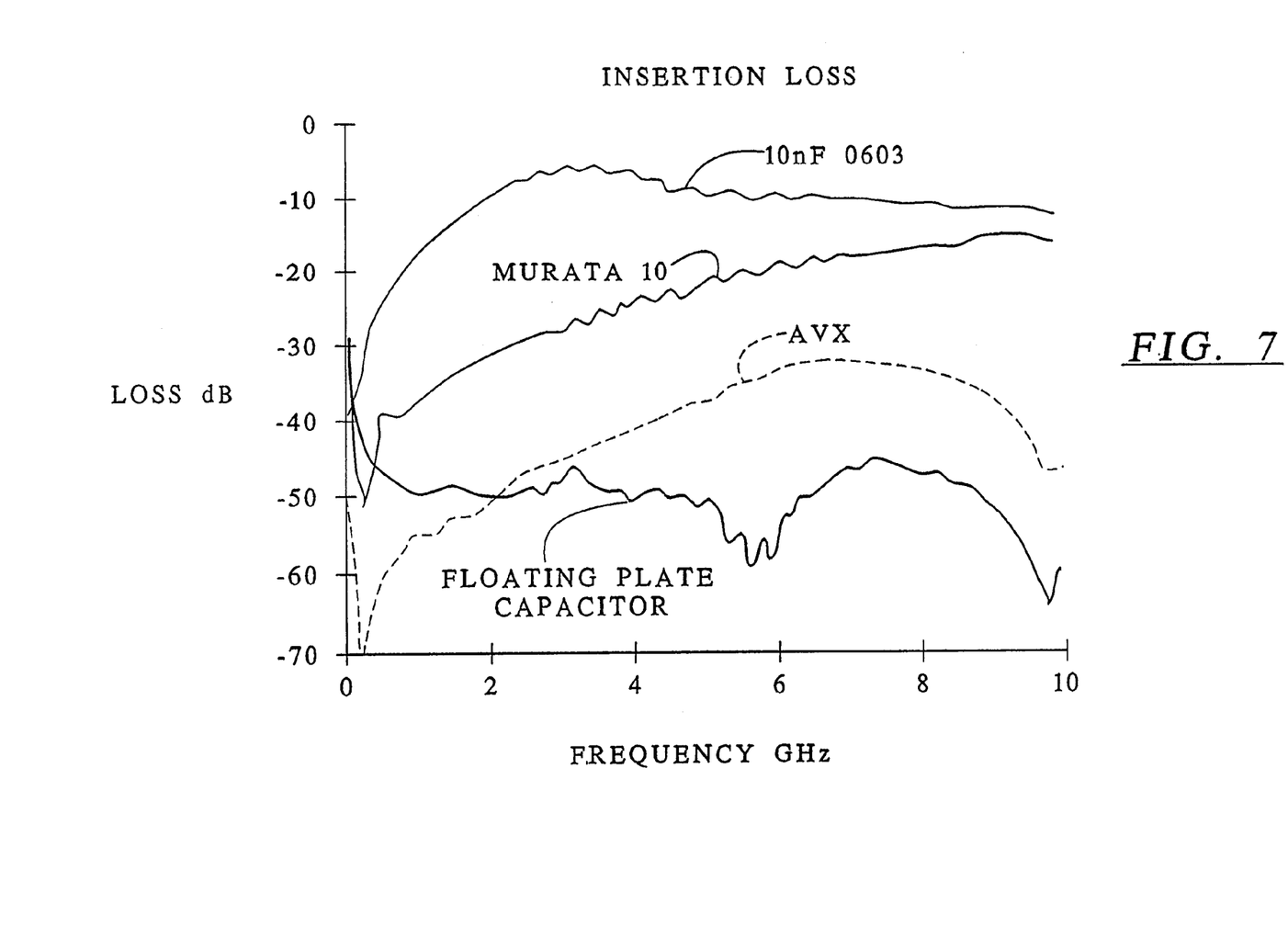
FIG. 7 illustrates insertion loss curves, over a frequency range from 0 to 10 GHz, for various prior art capacitors and a capacitor embodying principles of the invention.

In FIG. 6 there is illustrated a testing arrangement 100 utilized to produce the results illustrated in FIG. 7. As can be seen, in the testing arrangement, the capacitors were tested as two port networks, as is typical in microwave device testing.

In the testing arrangement 100, a capacitor 108 is tested by applying a variable frequency power source 102 across one side of the patterned plates 110 and 112 of the capacitor 108, with a small 50 ohm resistor 104 appropriately positioned in series to provide a load. Coupled across the opposite side of the patterned plates 110 and 112 of the capacitor 108 is a suitable voltage measuring device 106.

In FIG. 7 there is illustrated the result the measurement of insertion loss characteristics, over a wide frequency band, of several prior art capacitors mentioned above, as well as a capacitor embodying principles of the invention. The capacitors were a conventional ceramic chip capacitor of 10 nF, a Murata low inductance capacitor of 10 nF, an AVX LICA of 55 nF, and a capacitor embodying principles of the invention. In Table 1, below, the results of other measurements on prior art capacitors are presented.

For these measurements, capacitors were measured using an HP 4291A RF Impedance/Material Analyzer with low impedance probe head, an Alessi RM-06 probe station, and Cascade probe. For capacitors measured as in FIG. 7, an HP 8510B network analyzer was used with GS and SG probes. Each system was calibrated at the probe tips with a Tektronix CAL93 calibration substrate. The probe has two terminals on a fine 150 $\mu$m (6 mil) pitch.

In order to connect to the fine pitch probe, and to avoid introducing additional parasitic inductances from interconnections, a novel probing technique was devised. In this technique, the capacitors were mounted on a glass plate with non-conductive epoxy, and then conductive epoxy was used to extend the terminals to the center of the top surface of the capacitor body. The epoxy, after application with a fine wire and curing, was polished by burnishing with a piece of alumina. The epoxy was extended over the entire top surface of the capacitor, leaving only a narrow gap between the resulting extended terminals. The 150 $\mu$m (6 mil) pitch probe could then be applied to the epoxy terminals. To ensure good contact, the probe was worked back and forth under pressure to maximize the contact to the silver particles.

The insertion loss was measured for these capacitors over a frequency range from 0 to 10 GHz. Further, other data were taken for the prior art capacitors as described next.

With respect to the prior art capacitors, these capacitors, among others, also were measured from 1 MHz to 1.0 Ghz. The built-in modeling capability of the HP 4291A RF Impedance/Material Analyzer was used to fit a series RLC circuit model to the measured response. The resonant frequency of each capacitor was determined. As a measure of the usefulness of the capacitor for decoupling, the range of frequencies over which the capacitor had an impedance lower than 0.3$\Omega$ was obtained and is given in Table 1, below.

TABLE 1

Summary of capacitor measurements

| Device | Value nF | R m$\Omega$ | L pH | C nF | $f_r$ MHz | $f_l$ MHz | $f_h$ MHZ |
|---|---|---|---|---|---|---|---|
| 1206 | 100 | 126 | 707 | 74 | 22 | 7 | 70 |
| 0805 | 10 | 315 | 413 | 8.0 | 94 | — | — |

TABLE 1-continued

Summary of capacitor measurements

| Device | Value nF | R mΩ | L pH | C nF | $f_r$ MHz | $f_l$ MHz | $f_h$ MHZ |
|---|---|---|---|---|---|---|---|
| 0603 | 10 | 445 | 594 | 8.6 | 70 | — | — |
| 0805 | 2.2 | 481 | 568 | 2.0 | 154 | — | — |
| 0603 | 2.2 | 306 | 531 | 1.7 | 167 | — | — |
| Murata | 10 | 55 | 79 | 6.6 | 230 | 75 | 800 |
| Murata | 2.2 | 133 | 20 | 1.4 | 1000 | 355 | 1800 |
| AVX | 55 | 108 | 30 | 49 | 137 | 11 | 1500 |

The data reveal the limitations of the prior art capacitors commonly used for decoupling applications. All of the conventional chip capacitors exhibit high intrinsic inductance, because of the configurations of their plates and terminations. The 0805 and 0603 devices tested had high series resistances. If several of them were used in parallel, as usually is the case, this theoretically would not be a problem, and they would decouple frequencies higher than the 0.1 μF generally used. Of course, multiple 0.1 μF devices can be used in an effort to "brute force" a low impedance at high frequencies, but on MCM substrates, with expensive real estate, multiple capacitors take up a lot of room, and it makes more sense to use a small low inductance capacitor.

With respect to the Murata devices, these devices have gold terminations on opposite square faces. The manufacturer recommends attaching one face to a substrate pad with conductive epoxy, and wirebonding the top face to the other substrate terminal. This method degrades the performance of these devices by introducing the inductance of a wirebond. It is possible to mount this device with both termination faces vertical, by first using a dot of non-conductive epoxy to tack it down, and then applying conductive epoxy to the faces of the substrate pads. The resulting low inductance connections should give results similar to those achieved for the above measurements, which are better than the specifications given by the manufacturer of the devices.

With respect to the AVX LICA capacitor, it provides substantial capacitance with extremely low inductance over a fairly wide frequency range. However, it is difficult to mount, as its terminals are on the bottom. It was specially designed for IBM to be attached with flip chip solder bumps. Though versions are available with gold terminations, it is difficult to mount such a capacitor with conductive epoxy without shorting.

In FIG. 7, the results of measurements using the HP 8510B Network Analyzer for certain capacitors are illustrated. These measurements were performed in view of the limitations of the HP 4291A in making accurate measurements above 1.8 GHz. The range of the HP 4291A only goes to 1.8 GHz, and the measurement accuracy decreases substantially above 1 GHz at impedances less than 1.0Ω.

Measurements made with one probe were very sensitive to probe force and wipe. Thus, the capacitors were treated as two-port networks, just like a four-point probe resistance measurement. It can be appreciated that since decoupling capacitors are used to keep the noise from one circuit out of other circuits, measuring the insertion loss ($S_{12}$) is appropriate.

In these latter set of measurements, capacitors were measured by placing the probes at two locations along the top of the capacitor body, contacting the conductive epoxy. Because of the size difference of the capacitors, the distance between the probes varied in each case. Each probe was applied approximately ¼ of the body width in from the edges.

It is important to note that the frequency range where these devices actually function as capacitors is a small fraction of the frequency range presented in FIG. 7, except for the capacitor of the present invention. Thus, above 1 GHz, the impedance of these capacitors increases as the frequency increases, and the capacitors look more and more like resistors. The AVX LICA capacitor showed the best response below 2 GHz, but again, the response is not flat, and the increasing impedance effect can be seen to take place from less than 1 GHZ.

In contrast, the capacitor of the invention exhibits and is characterized by an insertion loss of at least −40 db from 1 GHz to at least 10 GHz. In fact, the graph shows that the capacitor of the invention exhibited and is characterized by an insertion loss of about at least −50 dB over that range. Clearly above 2 GHz, the capacitor of the present invention exhibited higher insertion loss than the prior art capacitors. Because of the novel combination of the present capacitor, no inductive resonance is observed. Instead, at high frequencies, the impedance is dominated by the resistive component of the R-L-C series equivalent circuit. This low resistance can be minimized by using appropriate metal thicknesses for the floating plate electrode and the two patterned plate electrodes, and by adjusting the geometry and connection points of the patterned plate electrodes in an appropriate manner. The high insertion loss for the capacitor of the invention is interpreted as indicating that the capacitor does not exhibit a significant increase in impedance between 1 GHz and 10 GHz.

Figure 8:
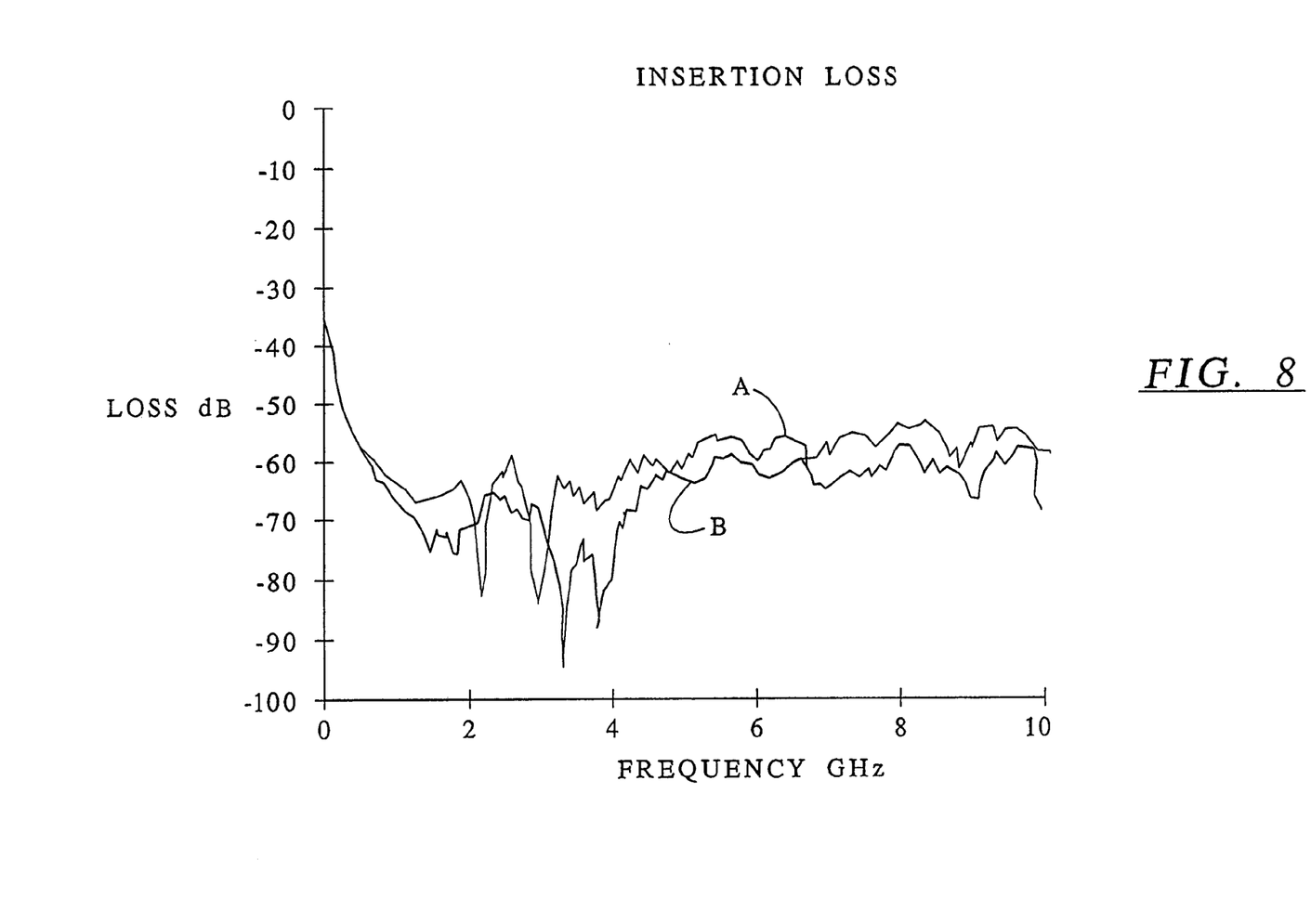
FIG. 8 illustrates an insertion loss curve from 0 to 10 GHz for a capacitor embodying principles of the invention, with measurements made from different connection points.

In FIG. 8 there are illustrated two different insertion loss curves for an 8 nF capacitor embodying principles of the invention. Curves A and B are plots taken at different measurement connections. Essentially, the pitch between the probes for Curve B was greater than that for Curve A (i.e., the probes were further apart for Curve B). The subject capacitor has a total area of 2 cm×2 cm. The dielectric layer was made of $SiO_2$ with a dielectric constant of Er=3.9. The plates were 1 μm thick.

Figure 9:
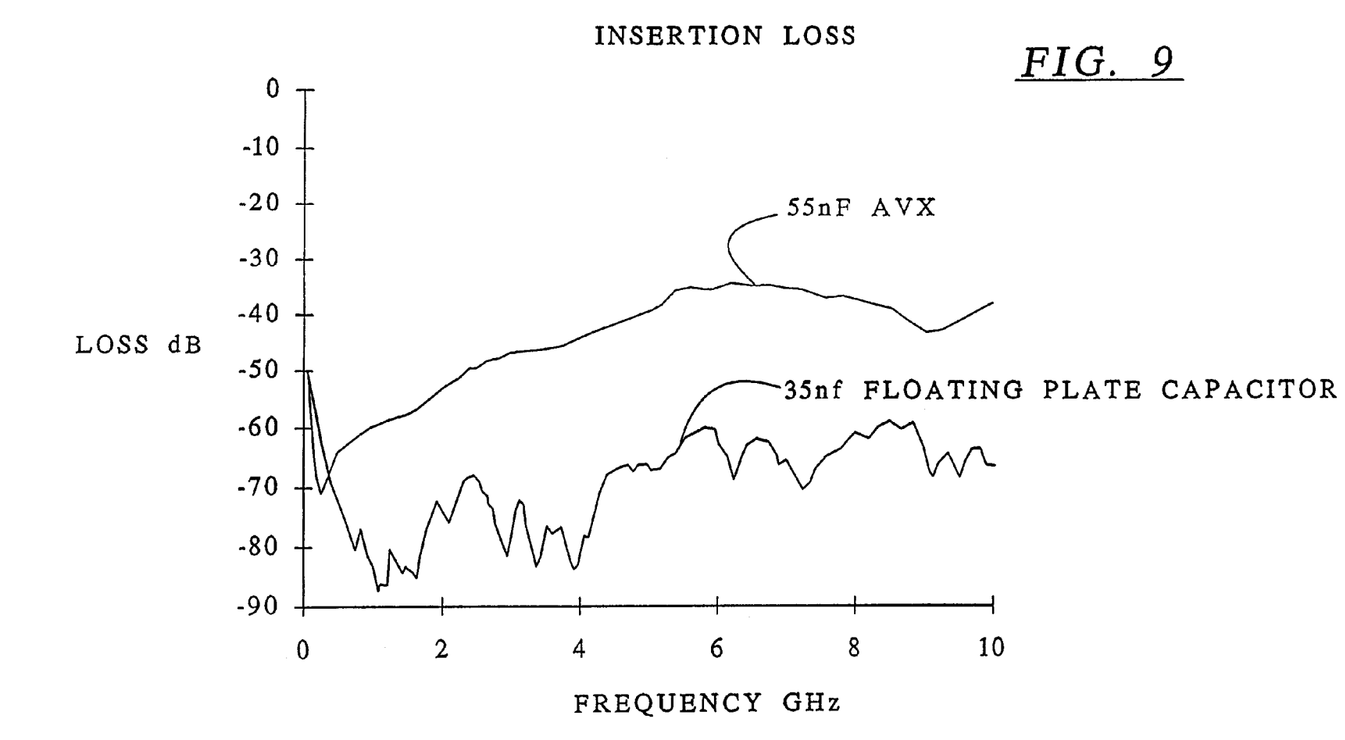
FIG. 9 illustrates insertion loss curves over a frequency range from 0 to 10 GHz for a 35 nF capacitor embodying principles of the invention and a 55 nF AVX capacitor.

In FIG. 9, a direct insertion loss comparison between a 35 nF capacitor embodying principles of the invention and a 55 nF AVX capacitor is provided. The capacitor of the invention had an area of 2 cm×2 cm. As can be seen, the capacitor embodying principles of the invention exhibited no inductive resonances.

Again, the curves for the capacitors embodying principles of the invention in FIGS. 8 and 9 indicate that the capacitors do not exhibit any significant increase in impedance between 1 GHz and 10 GHz.

It will be appreciated that modifications and changes to the foregoing embodiments are possible without departing from the spirit and scope of the invention. It is intended that such modifications and changes be encompassed by the following claims.

What is claimed is:

1. A method of forming a capacitor, comprising:
   a) providing a metallic layer effective to provide a floating plate electrode and on one side of which is provided an insulating layer;
   b) providing a dielectric layer on a side of the metallic layer opposite the insulating layer; and
   c) providing at least one pair of patterned plate electrodes on the dielectric layer on a side of the dielectric layer opposite the metallic layer,
   wherein the metallic layer, the dielectric layer, and the patterned plate electrodes are constructed to form a floating plate capacitor which exhibits an insertion loss of at least −40 db over a frequency range from about 1 GHz to about 10 GHz.

2. The method of claim 1, further comprising providing an insulating layer on a face of the metallic layer opposite the dielectric layer.

3. The method of claim 2, wherein said providing of the insulating layer comprises oxidizing one side of the metallic layer until a sufficiently electrically insulating layer is formed.

4. The method of claim 1, wherein the metallic layer is selected from the group consisting of aluminum or layered titanium/copper.

5. The method of claim 1, wherein the metallic layer is a sheet of aluminum foil.

6. The method of claim 1, wherein the dielectric layer is selected from the group consisting of barium titanate, tantalum oxide, aluminum oxide, an organic dielectric or an inorganic dielectric.

7. The method of claim 1, wherein said providing of the patterned plate electrodes comprises sputtering a photolithographically defined metal layer onto the dielectric layer.

8. The method of claim 1, wherein said providing of the patterned plate electrodes comprises screen printing a conductive ink or paste onto the dielectric layer.

9. The method of claim 2, wherein said providing of the metallic layer comprises providing a rollform metallic material.

10. The method of claim 9, wherein the insulating layer is applied to the rollform metallic material by lamination.

11. The method of claim 9, wherein the insulating layer is applied to the rollform metallic material by oxidation.

12. The method of claim 1, wherein a polymer sheet is coated with a metallic layer to provide an insulating layer and the metallic layer, respectively.

13. A method of forming a capacitor, comprising:
    (a) providing a sheet of metallic material effective to provide a floating plate electrode;
    (b) forming a dielectric layer on one side of the metallic sheet;
    (c) providing at least one pair of patterned plate electrodes on the dielectric layer on a side of the dielectric layer opposite the metallic sheet; and
    (d) excising an area of the resulting structure encompassing the patterned plate electrodes,
wherein the metallic sheet, the dielectric layer, and the patterned plate electrodes are constructed such that the excised area forms at least one floating plate capacitor with accessible connection points on said pair of patterned plate electrodes which are effective for operatively connecting the capacitor such that the capacitor does not exhibit an inductive resonance below a frequency of at least 1 GHz.

14. The method of claim 13, wherein said frequency is about 10 GHz.

15. A method of forming a capacitor, comprising:
    (a) providing a layer of insulating material;
    (b) depositing a metallic layer effective to provide a floating plate electrode on one face of the insulating layer;
    (c) forming a dielectric layer on the metallic layer;
    (d) forming at least one pair of patterned plate electrodes on the dielectric layer; and
    (e) excising an area of the resultant structure encompassing the patterned plate electrodes,
wherein the metallic sheet, the dielectric layer, and the patterned plate electrodes are constructed such that the excised area forms at least one floating plate capacitor with accessible connection points on said pair of patterned plate electrodes which are effective for operatively connecting the capacitor such that the capacitor does not exhibit an inductive resonance below a frequency of at least 1 GHz.

16. The method of claim 15, wherein said fequency is about 10 GHz.

17. A method of forming a capacitor, comprising:
    (a) providing a metallic thin-film layer effective to provide a floating plate electrode;
    (b) providing dielectric thin-film layer on a first side of said metallic layer; and
    (c) providing at least one pair of patterned plate electrodes on a side of the dielectric layer opposite the metallic layer,
    wherein the metallic layer, the dielectric layer, and the patterned plate electrodes are constructed to form at least one floating plate capacitor with accessible connection points on said pair of patterned plate electrodes which are effective for operatively connecting the capacitor such that the capacitor does not exhibit an inductive resonance below a frequency of at least 1 GHz.

18. The method of claim 17, further comprising providing an insulating layer on a second side of said metallic layer.

19. The method of claim 18, wherein said insulating layer is a polymer film.

20. The method of claim 19, wherein said metallic layer is provided from a rollform metallic material.

21. The method of claim 20, wherein said insulating layer is provided from a rollform insulating material and is laminated to said rollform metallic material.

22. The method of claim 19, wherein said insulating layer is provided from a rollform insulating material.

23. The method of claim 18, wherein said insulating layer is provided by oxidizing said second side of said metallic layer.

24. The method of claim 17, wherein said dielectric layer is formed by anodizing said first side of said metallic layer.

25. The method of claim 17, wherein said dielectric layer has a thickness not more than about 1 $\mu$m.

26. The method of claim 25, wherein a material of said dielectric layer is selected from the group consisting of barium titanate, tantalum oxide, aluminum oxide, organic dielectrics, and inorganic dielectrics.

27. The method of claim 25, wherein said dielectric has a thickness of at least about 2000 Å.

28. The method of claim 25, wherein said metallic layer has a thickness of at least about 1000 Å.

29. The method of claim 17, wherein said metallic layer has a thickness of at least about 1000 Å.

30. The method of claim 29, wherein said metallic layer has a thickness not more than about 2 $\mu$m.

31. The method of claim 29, wherein a material of said metallic layer is selected from the group consisting of aluminum and layered titanium/copper.

32. The method of claim 17, wherein said connection points include points disposed substantially at adjacent edges of said pair of patterned electrodes.

33. The method of claim 17, wherein said frequency is about 10 GHz.

* * * * *